United States Patent
Zhang et al.

(10) Patent No.: US 9,799,744 B2
(45) Date of Patent: Oct. 24, 2017

(54) TFT ARRAY SUBSTRATE, METHOD OF MANUFACTURING THE SAME AND DISPLAY DEVICE

(71) Applicants: BOE Technology Group Co., Ltd., Beijing (CN); Beijing BOE Optoelectronics Technology Co., Ltd., Beijing (CN)

(72) Inventors: Pengju Zhang, Beijing (CN); Zhilong Peng, Beijing (CN); Hao Wang, Beijing (CN); Mengxiao Pan, Beijing (CN); Huanping Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/070,265

(22) Filed: Mar. 15, 2016

(65) Prior Publication Data

US 2016/0293642 A1   Oct. 6, 2016

(30) Foreign Application Priority Data

Apr. 1, 2015   (CN) .......................... 2015 1 0152075

(51) Int. Cl.
 *H01L 27/12* (2006.01)
 *H01L 29/417* (2006.01)
 *H01L 29/423* (2006.01)
(52) U.S. Cl.
 CPC ...... *H01L 29/42384* (2013.01); *H01L 27/124* (2013.01); *H01L 27/1259* (2013.01); *H01L 29/41733* (2013.01)

(58) Field of Classification Search
 CPC ............ H01L 27/1224; H01L 27/1259; H01L 29/41733; H01L 29/42384
 (Continued)

(56) References Cited

U.S. PATENT DOCUMENTS 8,053,293 B2   11/2011   Kim et al.
9,373,701 B2   6/2016   Guo
(Continued)

FOREIGN PATENT DOCUMENTS

| CN | 101110443 | 1/2008 |
|---|---|---|
| CN | 102651401 | 8/2012 |
| CN | 103066017 | 4/2013 |

OTHER PUBLICATIONS

Office Action for Chinese Patent Application No. 201510152075.6, dated Mar. 20, 2017. 15 Pages.

*Primary Examiner* — Cuong Q Nguyen
*Assistant Examiner* — Tong-Ho Kim
(74) *Attorney, Agent, or Firm* — Westman, Champlin & Koehler, P.A.

(57) ABSTRACT

A method of manufacturing the TFT array substrate includes steps of: forming a first electrically conductive layer on the substrate, the first electrically conductive layer including a first electrically conductive pattern and a first signal line connected electrically to the first electrically conductive pattern located in a pixel region, and a first lead wire connected electrically to the first signal line; forming an insulation layer on the substrate formed with the first electrically conductive layer, the insulation layer including a first via-hole through which the first lead wire is exposed; and forming a second electrically conductive film on the substrate formed with the insulation layer, the second electrically conductive film being connected electrically to the first lead wire through the first via-hole in the insulation layer.

9 Claims, 6 Drawing Sheets

(58) Field of Classification Search
USPC .............................................. 257/72; 438/30
See application file for complete search history.

(56) References Cited

U.S. PATENT DOCUMENTS

| | | | |
|---|---|---|---|
| 9,391,097 B2 | 7/2016 | Yuan | |
| 2003/0071944 A1* | 4/2003 | Baek | G02F 1/133555 349/113 |
| 2003/0214614 A1* | 11/2003 | Chung | H01L 21/6734 349/58 |
| 2005/0285195 A1* | 12/2005 | Choi | H01L 27/1288 257/347 |
| 2008/0049158 A1* | 2/2008 | Choi | H01L 27/283 349/46 |
| 2014/0187001 A1* | 7/2014 | Guo | H01L 29/66765 438/158 |

* cited by examiner

TFT ARRAY SUBSTRATE, METHOD OF MANUFACTURING THE SAME AND DISPLAY DEVICE

CROSS-REFERENCE TO RELATED APPLICATION

This application claims the benefit of Chinese Patent Application No. CN201510152075.6 filed on Apr. 1, 2015 in the State Intellectual Property Office of China, the whole disclosure of which is incorporated herein by reference.

BACKGROUND OF THE INVENTION

Field of the Invention

Embodiments of the present disclosure relate to a display technology field, in particular, to a TFT array substrate, a method of manufacturing the same and a display device.

Description of the Related Art

During manufacturing a thin film transistor (TFT) array substrate, a static electricity accumulation often occurs. Moreover, a glass substrate with an insulation property is generally used to meet display requirement, thereby it is impossible to eliminate the static electricity accumulation occurring during the manufacturing process, so that it is apt to lead an electrostatic discharge (ESD) problem, which causes the performance of the array substrate to be deteriorated, even to be damaged, thereby reducing a product yield.

Further, during manufacturing the thin film transistor (TFT) array substrate, as conductors on different layers are overlapped, an insulation layer between conductors on different layers will be broken down if the electrostatic discharge occurs in the overlapped region, which results in a short circuit between lines on different layers and thus a display device failure.

SUMMARY OF THE INVENTION

Embodiments of the present disclosure provide a TFT array substrate, a method of manufacturing the same and a display device, which may reduce effectively the electrostatic discharge occurring during manufacturing the TFT array substrate and thus increase the product yield.

According to an aspect of the present disclosure, it is provided a method of manufacturing a TFT array substrate comprising steps of: forming a first electrically conductive layer on the substrate, the first electrically conductive layer comprising a first electrically conductive pattern and a first signal line connected electrically to the first electrically conductive pattern which is located in a pixel region, and a first lead wire connected electrically to the first signal line; forming an insulation layer on the substrate formed with the first electrically conductive layer, the insulation layer being formed with a first via-hole through which the first lead wires is exposed; and forming a second electrically conductive film on the substrate formed with the insulation layer, the second electrically conductive film being connected electrically to the first lead wire through the first via-hole formed in the insulation layer.

According to another aspect of the present disclosure, it is provided a TFT array substrate comprising a first electrically conductive layer, an insulation layer and a second electrically conductive layer arranged on the substrate sequentially, wherein, the first electrically conductive layer comprises: a first electrically conductive pattern and a first signal line connected electrically to the first electrically conductive pattern which are located in a pixel region; and a first lead wire connected electrically to the first signal line, the first signal line being electrically insulated from each other; the insulation layer is formed with a first via-hole through which the first lead wire is exposed; and the second electrically conductive layer comprises a second electrically conductive pattern and a second signal line connected electrically to the second electrically conductive pattern which are located in a pixel region, the second electrically conductive layer being in contact with the insulation layer.

According to another further aspect of the present disclosure, it is provided a display device comprising the array substrate according to the above embodiments.

BRIEF DESCRIPTION OF THE DRAWINGS

In order to explain the technical solutions in the embodiments of the present disclosure or in the prior art more clearly, the accompanying figures required by the description of the embodiments of the present disclosure or the prior art will be described briefly. Apparently, the described figures are only a part of embodiments of the present disclosure. Based on these figures, other figures may be obtained by those skilled in the art without creative effort.

FIG. 3a is schematic plan view showing forming an insulation layer including a first via-hole and a second electrically conductive film on the basis of FIG. 2a;

FIG. 4a is schematic plan view showing forming a second electrically conductive layer comprising a source electrode, a drain electrode, a data line, a lead wire of the data line, a first source and drain retaining pattern by patterning the second electrically conductive film on the basis of FIG. 3a;

DETAILED DESCRIPTION OF PREFERRED EMBODIMENTS OF THE INVENTION

Technical solutions in the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those skilled in the art without creative labor and those embodiments shall fall into the protection scope of the present invention.

Figure 1:
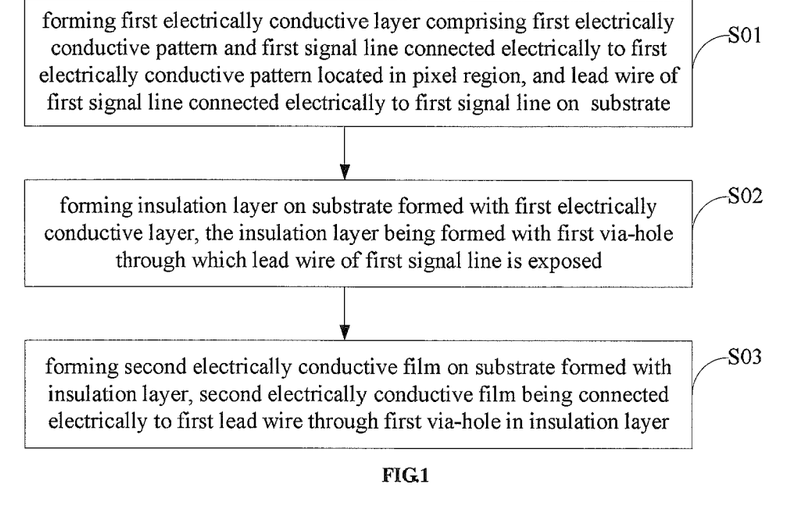
FIG. 1 is a schematic flow chart of a method of manufacturing an array substrate according to an embodiment of the present disclosure.

An embodiment of the present disclosure provides a method of manufacturing a TFT array substrate which comprises steps of (as shown in FIG. 1):

S01. forming a first electrically conductive layer on the substrate, the first electrically conductive layer comprising a first electrically conductive pattern and a first signal line connected electrically to the first electrically conductive pattern which are located in a pixel region; and a first lead wire for the first signal line connected electrically to the first signal line;

S02. forming an insulation layer on the substrate formed with the first electrically conductive layer, the insulation layer being formed with a first via-hole through which the first lead wire is exposed, respectively; and S03. forming a second electrically conductive film on the substrate formed with the insulation layer, the second electrically conductive film being connected electrically to the first lead wire through the first via-hole formed in the insulation layer.

It should be noted that, in various embodiments of the present disclosure, both material of the first electrically conductive pattern, the first signal line and the first lead wire and material of the second electrically conductive film are not limited. Moreover, type of the first signal line is not limited herein, and the first signal line may include any signal line which is formed on an array substrate and may produce an electrostatic discharge with other conductor, for example, the first signal line may comprise a gate line or a data line. Further, specific location of the first lead wire is not limited herein, the first lead wire may be located in the pixel region or in a peripheral wiring region. The substrate is not limited herein, the substrate may be provided with any film layer or no film layer, for example, the substrate may comprise a buffer layer, and the specific substrate may be set as desired.

In the method of manufacturing the TFT array substrate according to an embodiment of the present disclosure, as long as electric charge is accumulated in the first electrically conductive pattern and/or the first signal line, the accumulated charge is distributed into all the first signal line, the first electrically conductive pattern and the second electrically conductive film through an electric connection between the first lead wire and the second electrically conductive film. As a result, an electrostatic discharge due to a large electric potential difference between certain conductors and other conductors overlapped on different layers, which is caused by a charge accumulation on these conductors, will not occur. Thus, an embodiment of the present disclosure may reduce effectively the electrostatic discharge occurring during manufacturing the TFT array substrate and thus increase the product yield.

In an embodiment, the first electrically conductive layer further comprises a third signal line which is electrically insulated from the first signal line; the insulation layer further comprises a second via-hole through which the third signal line is exposed; the second electrically conductive film is electrically connected to the third signal line through the second via-hole.

Type of the third signal line is not limited herein, as long as is is different from the type of the first signal line.

As a result, as long as electric charge is accumulated in any one of the first electrically conductive pattern, the first signal line and the third signal line, the accumulated charge will be distributed into all of the first signal lines, the first electrically conductive pattern, the third signal line and the second electrically conductive film through electric connections between the first lead wires as well as the third signal line and the second electrically conductive film. Thus, the electrostatic discharge occurring during manufacturing the TFT array substrate is further reduced effectively.

In an embodiment, after forming the second electrically conductive film, the method further comprises a step of: performing an electrostatic elimination on the substrate formed with the second electrically conductive film.

As a result, static electricity accumulated in the first electrically conductive pattern, the first signal line, the first lead wire for the first signal line and the second electrically conductive film may be eliminated rapidly through the electrostatic elimination process.

In an embodiment, in view of a requirement of high resolution array substrate, the first lead wire for the first signal line is formed in the peripheral wiring region, thereby reducing a wiring complexity in the pixel region.

Further, the first lead wire is formed in the peripheral wiring region to transmit signals, that is, signals from a drive IC may be transmitted to the first signal line through bonding pad provided in the peripheral wiring region and the first lead wire, or signals from a drive circuit provided on the array substrate may be transmitted to the first signal line through the first lead wire.

In an embodiment, the method further comprises: after forming the second electrically conductive film, patterning the second electrically conductive film to form a second electrically conductive layer comprising a second electrically conductive pattern and a second signal line connected electrically to the second electrically conductive pattern in the pixel region.

Specifically, after patterning the second electrically conductive film, a plurality of the first signal lines are insulated from each other; or the first signal lines are insulated from each other, the third signal lines are insulated from each other, and the first signal lines are insulated from the third signal lines. In an embodiment, if the first electrically conductive layer does not comprise the third signal line, only the plurality of the first signal lines are insulated from each other after patterning the second electrically conductive film. In another embodiment, if the first electrically conductive layer further comprises the third signal line, after patterning the second electrically conductive film, in addition to insulating the first signal lines from each other, it is required to insulate the third signal lines from each other and insulate the first signal lines from the third signal lines.

Further, as the first electrically conductive pattern and the first signal line cannot be electrically connected with the second electrically conductive pattern and the second signal line on a different layer when the TFT array substrate is in a normal work state, in the final TFT array substrate, the above first lead wire will be insulated electrically from the second electrically conductive pattern and the second signal line formed by patterning the second electrically conductive film. Thus, the above operation of electrostatic elimination may be performed before patterning the second electrically conductive film.

The second electrically conductive film is used to distribute the charge accumulated in the first electrically conductive pattern, the first signal line and/or the third signal line, and then is used to form the second electrically conductive pattern and the second signal line, thereby reducing effectively the electrostatic discharge occurring during manufacturing the TFT array substrate and also forming the patterns required by the array substrate so as to simplify the process thereof.

In an embodiment, the second electrically conductive layer further comprises a second lead wire for the second signal line located in the peripheral wiring region and connected electrically to the second signal line. In other words, the second lead wire for the second signal line connected electrically to the second signal line may also be formed in the peripheral wiring region while patterning the second electrically conductive film to form the second electrically conductive pattern in the pixel region and the second signal line connected electrically to the second electrically conductive pattern.

Signals from a drive IC may be transmitted to the second signal line through bonding pads in the peripheral wiring region and the second lead wire, or signals from a drive circuit on the array substrate may be transmitted to the second signal line through the second lead wire.

Further, as material of the second electrically conductive film may be the same as material of the first lead wire and/or the third signal line, such as metallic material, the first lead wire exposed through the first via-hole and the third signal line exposed through the second via-hole are etched when the second electrically conductive film covering the first via-hole, or the first and second via-holes in the insulation layer are etched, and the second electrically conductive film is etched. Thus, in the embodiment of the present disclosure, the second electrically conductive layer further comprises an electrically conductive retaining pattern covering the first via-hole, or the first and second via-holes. In other words, the electrically conductive retaining pattern covering the first via-hole, or the first and second via-holes are further formed while the second signal line and the second lead wire are formed, and the electrically conductive retaining pattern is electrically insulated from the second signal line and/or the third signal line.

In an embodiment, if the first electrically conductive layer does not comprise the third signal line, the insulation layer only comprises the first via-hole provided in the peripheral wiring region. In this case, the electrically conductive retaining pattern only covers the first via-hole correspondingly and the electrically conductive retaining pattern is electrically insulated from the second signal line.

In another embodiment, if the first electrically conductive layer further comprises the third signal line, the insulation layer comprises the first via-hole and the second via-hole. In this case, the electrically conductive retaining pattern covers the first and second via-holes correspondingly and the electrically conductive retaining pattern is electrically insulated from the second and third signal line; wherein the first via-hole is formed in the peripheral wiring region and a location of the second via-hole may be determined depending on a location of the third signal line.

Figure 2A:
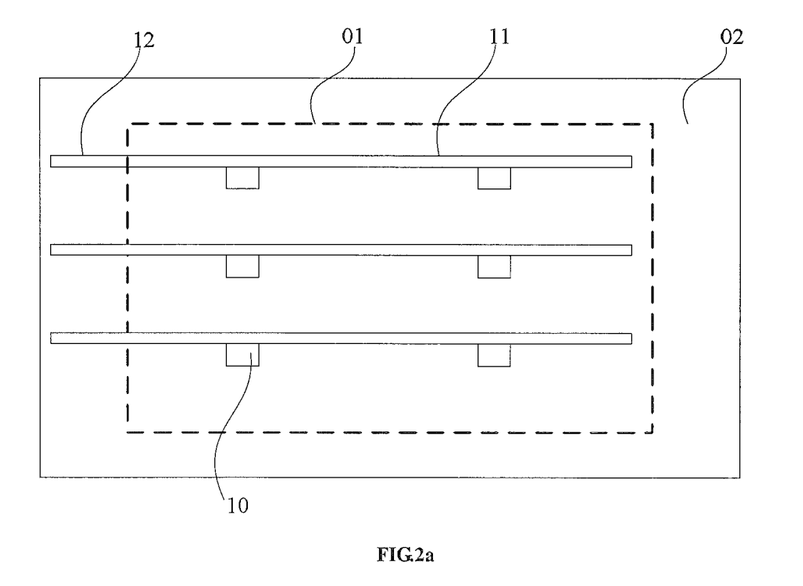
FIG. 2a is schematic plan view showing forming a first electrically conductive layer comprising a gate electrode, a gate line and a gate lead wire on the substrate according to an embodiment of the present disclosure.
Figure 2B:
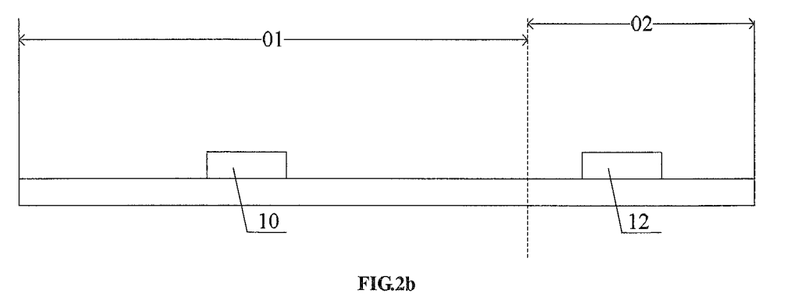
FIG. 2b is schematic sectional view showing forming the first electrically conductive layer comprising the gate electrode, the gate line and the gate lead wire on the substrate according to the embodiment of the present disclosure.

In a case that the first electrically conductive layer further comprises the third signal line, as shown in FIGS. 2a and 2b, the first electrically conductive pattern may be a gate electrode 10, the first signal line may comprise a gate line 11 (not shown in FIG. 2b) connected electrically to the gate electrode 10, and the first lead wire may comprises a gate lead wire 12 connected electrically to the gate line 11. The gate electrodes 10 and the gate line 11 are located in the pixel region 01, the gate lead wire 12 is located in the peripheral wiring region 02 and the third signal line may be located in the pixel region and/or in the peripheral wiring region around the pixel region.

In an embodiment, the third signal line may comprise a common electrode line, or a power source line, and/or a wiring forming a gate drive circuit, and/or a wiring forming a source drive circuit.

In an embodiment, the second electrically conductive film is patterned to form a second electrically conductive layer comprising: the second electrically conductive pattern and the second signal line connected electrically to the second electrically conductive pattern which are located in the pixel region; the second lead wire for the second signal line located in the peripheral wiring region around the pixel region and connected electrically to the second signal line; and the electrically conductive retaining pattern covering the first via-hole and the second via-hole.

In an embodiment, the TFT is a bottom-gate TFT, that is, the gate electrode of the TFT is located below the source and drain electrodes with respect to the substrate. As shown in FIGS. 3b, 4a and 4b, the second electrically conductive film 20 is patterned to form a second electrically conductive layer comprising: a source electrode 21, a drain electrode 22 and a data line 23 (not shown in FIG. 4b) connected electrically to the source electrode 21 (or the drain electrode) which are located in the pixel region 01; and a data lead wire 24 (not shown in FIG. 4b) for the data line 23 located in the peripheral wiring region 02 around the pixel region 01 and connected electrically to the data line 23; a first source and drain retaining pattern 25 covering the first via-hole 31; and a second source and drain retaining pattern (not shown in FIGS. 4a and 4b) covering the second via-hole (not shown). The first source and drain retaining pattern 25 is located in the peripheral wiring region 02, and the second source and drain retaining pattern is located in the pixel region and/or in the peripheral wiring region, and its specific location is determined depending on the location of the third signal line.

Figure 3A:
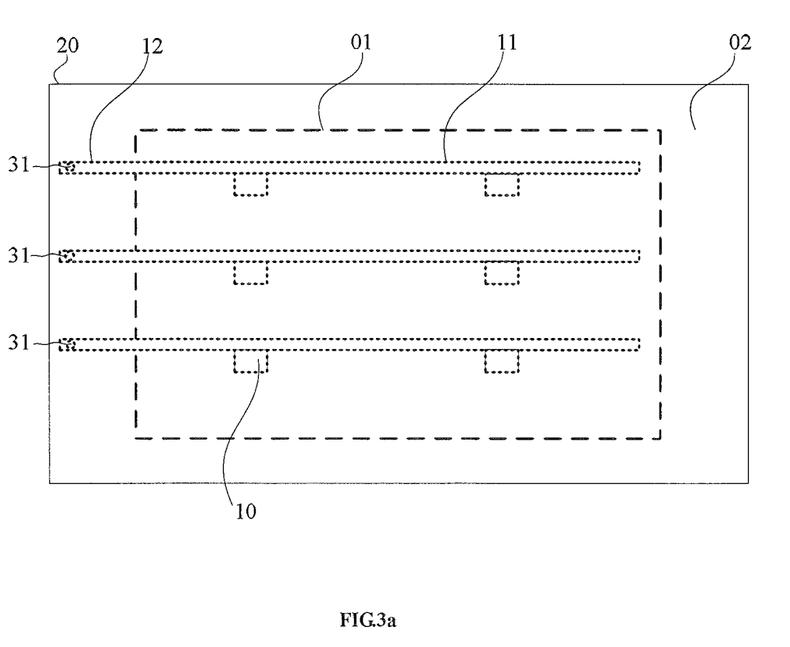
Figure 3B:
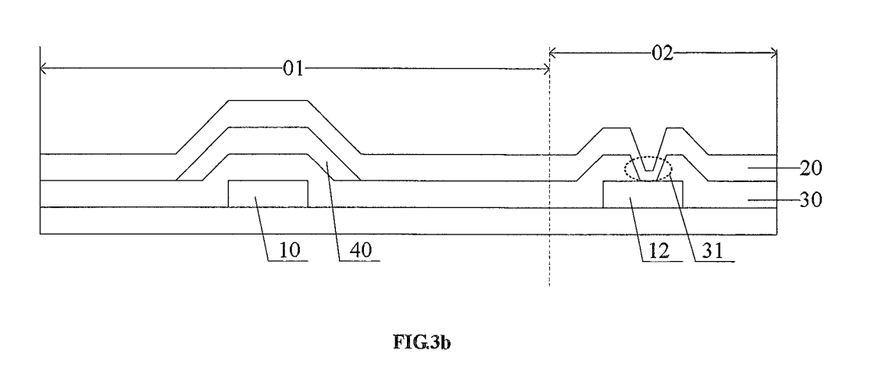
FIG. 3b is schematic sectional view showing forming the insulation layer including the first via-hole and the second electrically conductive film on the basis of FIG. 2b.
Figure 4A:
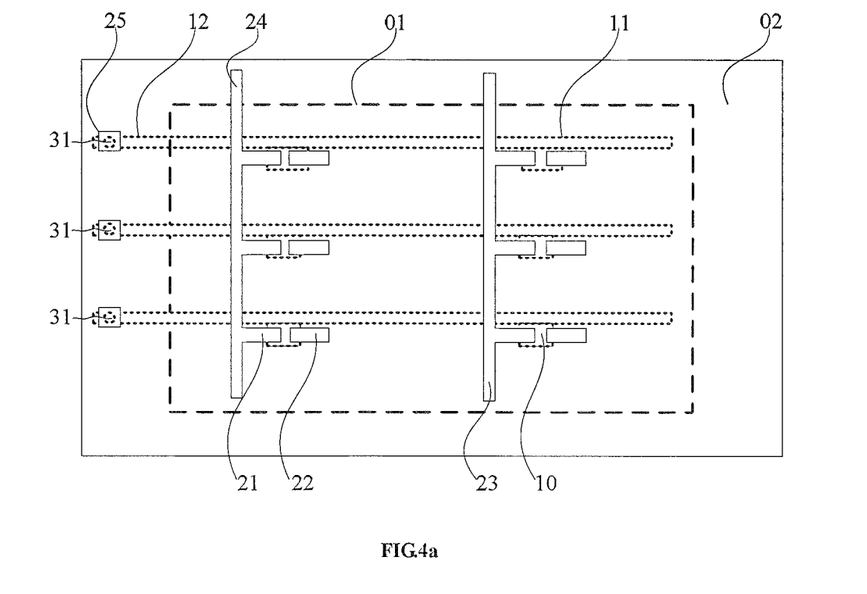
Figure 4B:
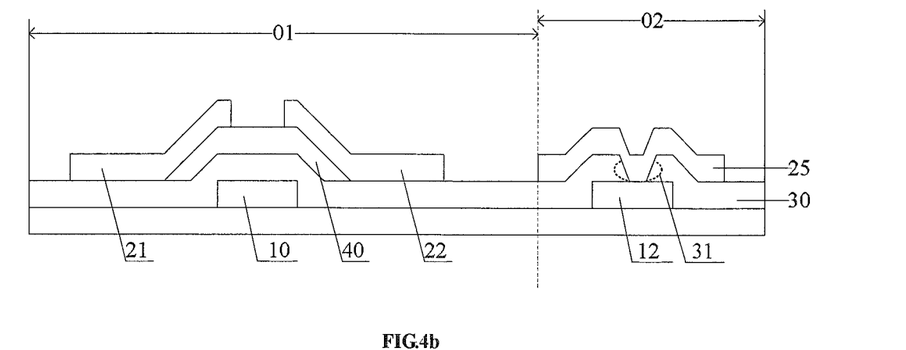
FIG. 4b is schematic sectional view showing forming the second electrically conductive layer comprising the source electrode, the drain electrode, the data line, the lead wire of the data line, and the first source and drain retaining pattern by patterning the second electrically conductive film on the basis of FIG. 3b.

Specifically, as shown in FIGS. 2a and 2b, firstly, forming the gate electrodes 10 and a gate line 11 (not shown in FIG. 2b) connected electrically to the gate electrodes 10 in the pixel region 01; secondly, forming the gate lead wire 12 connected electrically to the gate line 11 in the peripheral wiring region 02 and forming the third signal line (not shown in FIGS. 2a and 2b), wherein the third signal line may be located in the pixel region and/or in the peripheral wiring region; then, as shown in FIGS. 3a and 3b, forming a gate insulation layer 30 (not shown in FIG. 3a), in which the first via-hole 31 through which the gate lead wires 12 are exposed and a second via-hole (not shown) through which the third signal line is exposed, are formed.

Thereafter, forming a semiconductor active layer 40 (not shown in FIG. 3a); forming a second electrically conductive film 20 (shown in FIG. 3b) which is connected electrically to the gate lead wire 12 through the first via-hole 31 and to the third signal line through the second via-hole; then as shown in FIGS. 4a and 4b, patterning the second electrically conductive film 20 to form: the source electrode 21, the drain electrode 22 and the data line 23 (not shown in FIG. 4b) connected electrically to the source electrode 21 (or the drain electrode 22) in the pixel region 01; and the data lead wire 24 (not shown in FIG. 4b) for the data line located in the peripheral wiring region 02 and connected electrically to the data line 23; the first source and drain retaining pattern 25 covering the first via-hole; and the second source and drain retaining pattern (not shown in FIGS. 4a and 4b) covering the second via-hole. Those skilled in the art may understand that it is necessary to form a TFT during forming the TFT array substrate, and the semiconductor active layer is formed before forming the second electrically conductive film and after forming the gate insulation layer.

Therefore, the TFT in the pixel region 01 of the TFT array substrate is formed. During the process, if the third signal line is used as a wiring of a gate drive circuit, the gate drive circuit comprising a plurality of TFTs is formed in the peripheral wiring region 02 while the TFT is formed in the pixel region 01. Signals from the gate drive circuit are transmitted to the gate line 11 through the gate lead wire 12 to control the TFT to switch on/off.

It should be noted that, as the first electrically conductive layer is covered with the insulation layer, a pattern of the first electrically conductive layer is schematically shown by dotted lines in FIG. 3.

Figure 5:
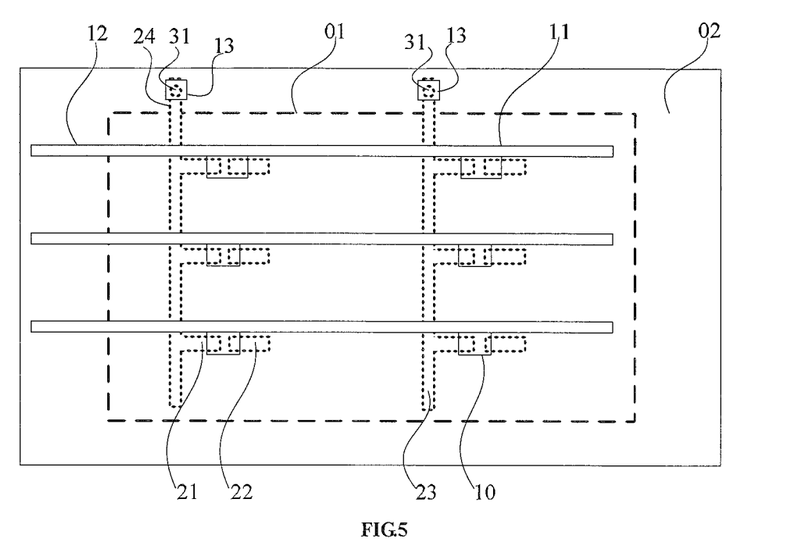
FIG. 5 is schematic plan view showing forming a second electrically conductive layer comprising a gate electrode, a gate lead wire after forming a first electrically conductive layer comprising a source electrode, a drain electrode, a data line, a lead wire of the data line, and a first source and drain retaining pattern according to another embodiment of the present disclosure.

Of course, in a case that the first electrically conductive layer further comprises the third signal line, as shown in FIG. 5, the first electrically conductive pattern may comprise the source electrode 21 and the drain electrode 22, the first signal line may comprise the data line 23 connected electrically to the source electrode 21 or the drain electrode 22, and the first lead wire may comprise the data lead wire 24 connected electrically to the data line 23. The source electrode 21, the drain electrode 22 and the data line 23 are located in the pixel region 01, the data lead wire 24 is located in the peripheral wiring region 02 and the third signal line may be located in the pixel region and/or in the peripheral wiring region as necessary.

In an embodiment, the third signal line may comprise a common electrode line, or a power source line, and/or a wiring forming a gate drive circuit, and/or a wiring forming a source drive circuit.

In another embodiment, the TFT is a top-gate TFT, that is, the gate electrode is located above the source and drain electrodes with respect to the substrate. As shown in FIG. 5, the second electrically conductive film is patterned to form a second electrically conductive layer comprising: a second electrically conductive pattern in the pixel region; a second signal line connected electrically to the second electrically conductive pattern; a second lead wire for the second signal line located in the peripheral wiring region and connected electrically to the second signal line; and an electrically conductive retaining pattern covering the first via-hole and the second via-hole respectively. This step of forming the second electrically conductive layer specifically comprises steps of: patterning the second electrically conductive film to form a second electrically conductive layer comprising: a gate electrode 10 and a gate line 11 connected electrically to the gate electrode 10 which is located in the pixel region 01; a gate lead wire 12 located in the peripheral wiring region 02 and connected electrically to the gate line 11; a first gate retaining pattern 13 covering the first via-hole 31; and a second gate retaining pattern (not shown in FIG. 5) covering the second via-hole (not shown in FIG. 5). The first gate retaining pattern 13 is located in the peripheral wiring region 02. The second gate retaining pattern is located in the pixel region and/or in the peripheral wiring region, and its specific location is determined depending on the location of the third signal line.

Specifically, firstly, forming the source electrode 21 or the drain electrode 22, and a data line 23 connected electrically to the source electrode 21 (or the drain electrode 22) in the pixel region 01; forming the data lead wire 24 for the data line connected electrically to the data line 23 in the peripheral wiring region 02 and forming third signal line (not shown in FIG. 5), wherein the third signal line may be located in the pixel region and/or in the peripheral wiring region; then forming a semiconductor active layer; thereafter, forming a gate insulation layer (not shown in FIG. 5), in which the first via-hole 31, through which the lead wire 24 of the data line is exposed, and the second via-hole (not shown in FIG. 5), through which the third signal line is exposed, are formed; then forming the second electrically conductive film 20 (not shown in FIG. 5) which is connected electrically to the data lead wire 24 through the first via-hole 31 and to the third signal line through the second via-hole; thereafter, the second electrically conductive film 20 is patterned to form: the gate electrode 10 and the gate line 11 connected electrically, to the gate electrode 10 in the pixel region 01; the gate lead wire 12 connected electrically to the gate line 11 in the peripheral wiring region 02; the first gate retaining pattern 13 covering the first via-hole 31; and the second gate retaining pattern (not shown in FIG. 5) covering the second via-hole. Those skilled in the art may understand that it is necessary to form a TFT during forming the TFT array substrate, then the step of forming the semiconductor active layer may be further included in the above steps.

Therefore, the TFT in the pixel region of the TFT array substrate is formed. During the process, if the third signal line is used as a wiring of a source drive circuit, the source drive circuit comprising a plurality of TFTs is formed in the peripheral wiring region 02 while the TFT is formed in the pixel region 01. Signals from the source drive circuit are transmitted to the data line 23 through the lead wire 24 of the data line.

It should be noted that, as the first electrically conductive layer is covered with the insulation layer, a pattern of the first electrically conductive layer is schematically shown by dotted lines in FIG. 4.

Figure 6A:
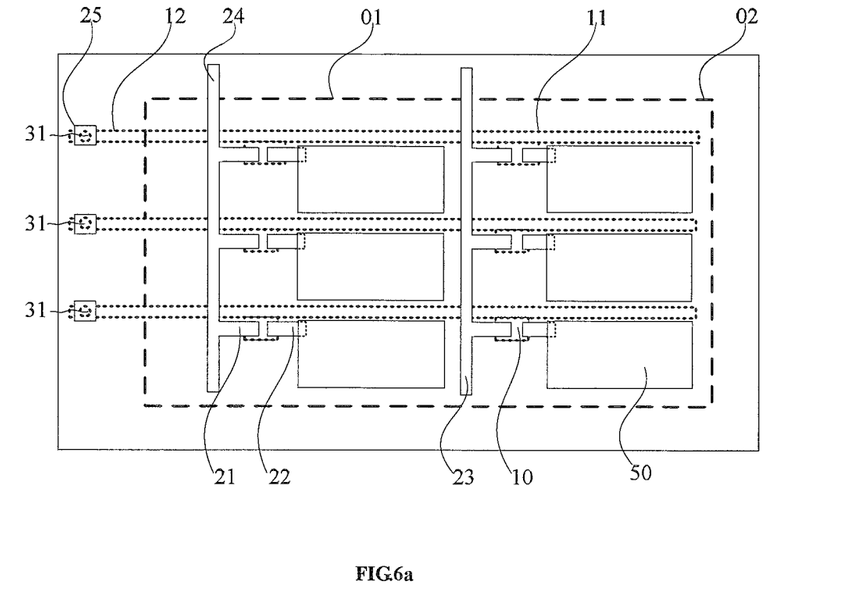
FIG. 6a is a schematic plan view showing forming a first electrode on the basis of FIG. 4a according to an embodiment of the present disclosure.
Figure 6B:
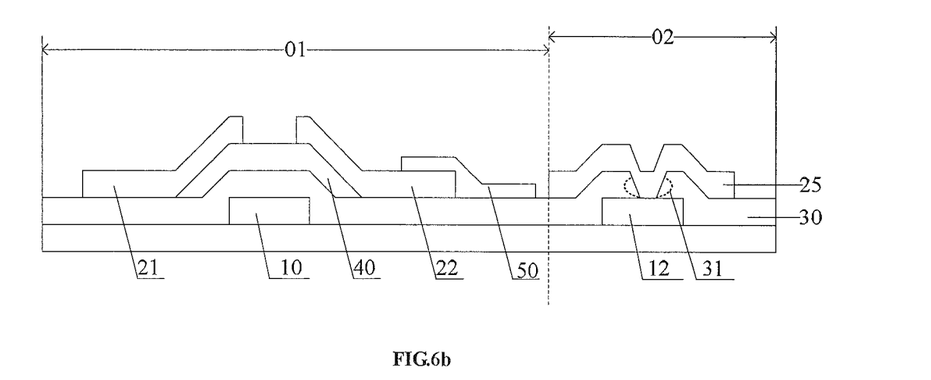
FIG. 6b is a schematic sectional view showing forming a first electrode on the basis of FIG. 4b according to the embodiment of the present disclosure.
Figure 6C:
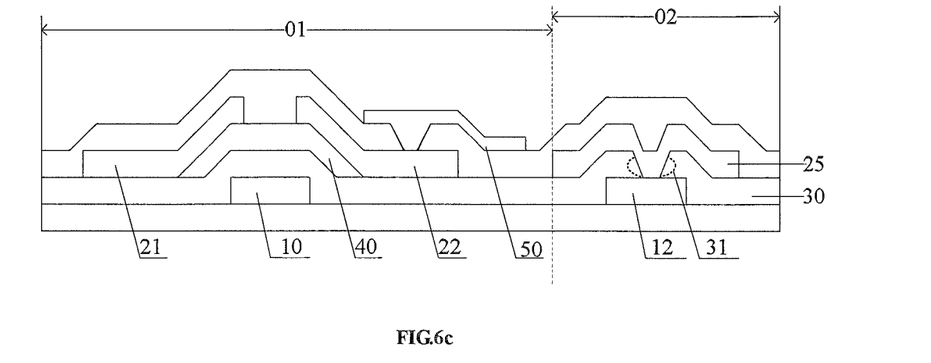
FIG. 6c is a schematic sectional view showing forming a first electrode on the basis of FIG. 4b according to another embodiment of the present disclosure.

In an embodiment, as shown in FIGS. 6a, 6b and 6c, the method of manufacturing the TFT array substrate further comprises a step of: forming a first electrode 50 connected electrically to the drain electrode 22 in the pixel region 01.

In the embodiments shown in FIGS. 3a to 4b, the source electrode 21 and the drain electrode 22 are formed after forming the gate electrode 10, and the first electrode 50 may be connected electrically to the drain electrode 22 directly, or may also be connected electrically to the drain electrode 22 indirectly, for example, through a via-hole. If the first electrode 50 is connected electrically to the drain electrode 22 directly, the first electrode 50 may be formed prior to the drain electrode 22, that is, the first electrode 50 may be formed before the second electrically conductive film 20 is formed, then the second electrically conductive film 20 is patterned to form the drain electrode. Referring to FIG. 6b, the first electrode 50 may be formed after forming the drain electrode 22. If the first electrode 50 is connected electrically to the drain electrode 22 indirectly, as shown in FIG. 6c, after the drain electrode 22 is formed, a protective layer comprising a via-hole through which the drain electrode 22 is exposed is formed and then the formed first electrode 50 is connected electrically to the drain electrode 22 through the via-hole formed in the protective layer.

In the embodiment shown in FIG. 5, the source electrode 21 and the drain electrode 22 are formed prior to the gate electrode 10, and the first electrode 50 is connected electrically to the drain electrode 22 indirectly.

In an embodiment, the first electrode 50 may be used as a pixel electrode. In this case, the method of manufacturing the ITT array substrate further comprises a step of forming a common electrode.

Figure 7:
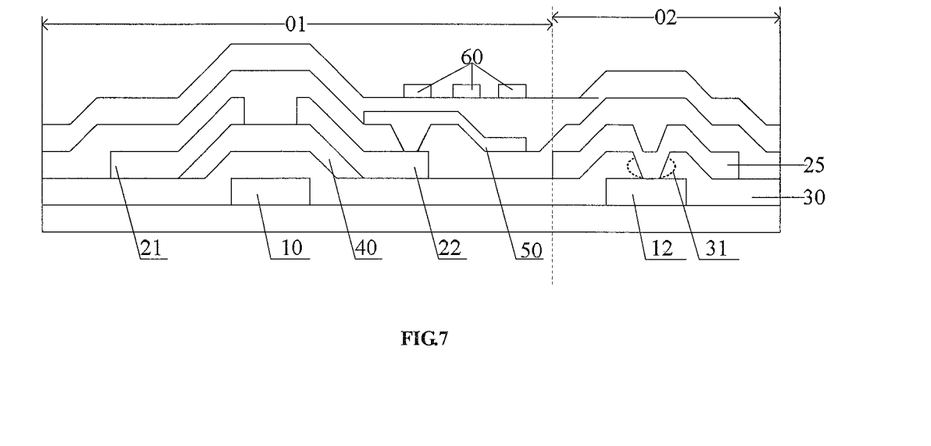
FIG. 7 is a schematic sectional view showing forming a common electrode on the basis of FIG. 6c.

As for an in-plane switch (IPS) array substrate, the pixel electrode and the common electrode are arranged in one layer and spaced apart from each other, and are formed as strip electrodes. As for an advanced-super dimensional switching (ADS) array substrate, as shown in FIG. 7, the pixel electrode and the common electrode are arranged in different layers, wherein an upper electrode is formed as a strip electrode and a lower electrode is formed as a plate electrode.

The first electrode 50 may also be used as an anode or a cathode. In this case, the method of manufacturing the TFT array substrate further comprises a step of: forming an organic functional layer, and an anode or a cathode. Specifically, the step comprises a step of forming the organic functional layer and the cathode if the first electrode 50 is used as the anode; and the step comprises a step of forming the organic functional layer and the anode if the first electrode 50 is used as the cathode.

In an embodiment, the organic functional layer comprises at least an electron transport layer, a luminescent layer and a hole transport layer. In order to increase an efficiency of injecting electrons and holes into the luminescent layer, the organic functional layer may also comprise an electron injection layer disposed between the cathode and the electron transport layer, and a hole injection layer disposed between the anode and the hole transport layer.

A flexible display substrate may be sorted into a single-side light emitting flexible display substrate and a double-side light emitting flexible display substrate according to materials of the anode and the cathode. If one of the anode and the cathode includes opaque material, the flexible display substrate is a single-side light emitting type. If both the anode and the cathode include transparent material, the flexible display substrate is a double-side light emitting type.

According to another aspect of the present disclosure, it is provided a TFT array substrate comprising: a first electrically conductive layer, an insulation layer and a second electrically conductive layer sequentially arranged on the substrate. The first electrically conductive layer comprises: a first electrically conductive pattern and a first signal line connected electrically to the first electrically conductive pattern in a pixel region; and a first lead wire connected electrically to the first signal line, and a plurality of the first signal lines are insulated from each other. The insulation layer is formed with a first via-hole through which the first lead wires are exposed, and the second electrically conductive layer comprises a second electrically conductive pattern in the pixel region and a second signal line connected electrically to the second electrically conductive pattern; and the second electrically conductive layer contacts with the insulation layer.

It should be noted that, in various embodiments of the present disclosure, both material of the first electrically conductive pattern, the first signal line and the first lead wire and material of the second electrically conductive film are not limited. Moreover, a type of the first signal line is not limited herein, and the first signal line may include any signal line which is formed on an array substrate and may produce an electrostatic discharge with other conductors, for example, the first signal line may comprise a gate line or a data line. Further, specific location of the first lead wire is not limited herein, the first lead wire may be located in the pixel region or in a peripheral wiring region. The substrate is not limited, the substrate may be provided with any film layers or no film layers, for example, the substrate may comprise a buffer layer, and the specific substrate may be set as desired.

In the method of manufacturing the TFT array substrate according to the embodiments of the present disclosure, as the insulation layer is provided with the via-hole through which the first lead wire is exposed, the second electrically conductive film is connected electrically to the first lead wire through the via-hole after the second electrically conductive film for forming the second electrically conductive layer is deposited. In this case, as long as electric charge is accumulated in the first electrically conductive pattern and/or the first signal line, the accumulated charge will be distributed evenly into all of the first signal line, the first electrically conductive pattern and the second electrically conductive film through an electric connection between the first lead wire and the second electrically conductive film. As a result, an electrostatic discharge due to a large electric potential difference between certain conductors and other conductors overlapped on different layers, which is caused by a charge accumulation on these conductors, will not occur. Thus, the embodiments of the present disclosure may reduce effectively the electrostatic discharge occurring during manufacturing the TFT array substrate and thus increase the product yield.

In an embodiment, the first electrically conductive layer further comprises a third signal line which is insulated from the first signal line; the insulation layer is further formed with a second via-hole through which the third signal line is exposed, wherein a plurality of the third signal lines are insulated from each other.

A type of the third signal line is not limited herein, as long as it is different from the type of the first signal line.

As a result, as long as electric charge is accumulated in any one of the first electrically conductive pattern, the first signal line and the third signal line, the accumulated charge will be distributed into all the first signal lines, the first electrically conductive pattern, the third signal line and the second electrically conductive film through electric connections between the first lead wires as well as the third signal line and the second electrically conductive film. Thus, the electrostatic discharge occurring during manufacturing the TFT array substrate is further reduced effectively.

In view of a requirement of high resolution array substrate, the first lead wire are formed in the peripheral wiring region, thereby reducing a wiring complexity in the pixel region.

Further, the first lead wire are formed in the peripheral wiring region to transmit signals. Specifically, signals from a drive IC may be transmitted to the first signal line through bonding pad provided in the peripheral wiring region and the first lead wire, or signals from a drive circuit provided on the array substrate may be transmitted to the first signal line through the first lead wire.

Further, the second electrically conductive layer further comprises a second lead wire located in the peripheral wiring region and connected electrically to the second signal line.

Signals from a drive IC may be transmitted to the second signal line through bonding pad in the peripheral wiring region and the second lead wire, or signals from a drive circuit on the array substrate may be transmitted to the second signal line through the second lead wire.

Further, as material of the second electrically conductive film may be the same as material of the first lead wire and/or the third signal line, such as metallic material, the first lead wire exposed through the first via-hole and the third signal line exposed through the second via-hole are etched when the second electrically conductive film covering the first via-hole or the first and a second via-hole in the insulation layer is etched, and the second electrically conductive film is etched. Thus, in the embodiment of the present disclosure, the second electrically conductive layer further comprises an electrically conductive retaining pattern covering the first via-hole, or the first and second via-holes. The electrically conductive retaining pattern is electrically insulated from the second signal line and/or the third signal line.

In an embodiment, if the first electrically conductive layer does not comprise the third signal line, the insulation layer only comprise the first via-hole in the peripheral wiring region. In this case, the electrically conductive retaining pattern only covers the first via-hole correspondingly and the electrically conductive retaining pattern is electrically insulated from the second signal line.

In another embodiment, if the first electrically conductive layer further comprises the third signal line, the insulation layer comprises the first via-hole and the second via-hole. In this case, the electrically conductive retaining pattern covers the first and second via-holes correspondingly and the electrically conductive retaining pattern is electrically insulated from the second and third signal lines; wherein the first via-hole is formed in the peripheral wiring region and a location of the second via-hole may be determined depending on a location of the third signal line.

In a case that the first electrically conductive layer further comprises the third signal line, as shown in FIGS. 4a and 4b, the first electrically conductive layer may comprise a gate conductive layer. In this case, the first electrically conductive pattern may comprise a gate electrode 10, the first signal line may comprise a gate line 11 (not shown in FIG. 4b), and the first lead wire may comprise a gate lead wire 12. The gate electrode 10 and the gate line 11 are located in the pixel region 01, the gate lead wire 12 is located in the peripheral wiring region 02, and the third signal line may be located in the pixel region and/or in the peripheral wiring region around the pixel region.

In an embodiment, the third signal line may comprise a common electrode line, or a power source line, and/or a wiring forming a gate drive circuit, and/or a wiring forming a source drive circuit.

The second electrically conductive layer may be an electrically conductive layer for forming the source and drain electrodes. In this case, the second electrically conductive pattern comprises a source electrode 21 and a drain electrode 22, the second signal line is formed into a data line 23 (not shown in FIG. 4b) connected electrically to the source electrode 21 or the drain electrode 22, the second lead wire is formed into a data lead wire 24 (not shown in FIG. 4b) for the data line, and the electrically conductive retaining pattern comprises a first source and drain retaining pattern 25 and a second source and drain retaining pattern (not shown in FIGS. 4a and 4b). The first source and drain retaining pattern 25 covers the first via-hole 31, and the second source and drain retaining pattern covers the second via-hole (not shown in FIGS. 4a and 4b). The source electrode 21, the drain electrode 22 and the data line 23 are located in the pixel region 01, the data lead wires 24 and the first source and drain retaining pattern 25 are located in the peripheral wiring region 02 around the pixel region 01, and the second source and drain retaining pattern is located in the pixel region and/or in the peripheral wiring region, and its specific location is determined depending on the location of the third signal line.

Though a semiconductor active layer is not mentioned in the above structure, those skilled in the art may understand that it is necessary to form a TFT during forming the TFT array substrate. Thus, in the above embodiment, it is necessary to form the semiconductor active layer, and it can be determined that the semiconductor active layer is formed before forming the second electrically conductive film and after forming the gate insulation layer.

Therefore, the TFT in the pixel region 01 of the TFT array substrate is formed. During the process, if the third signal line comprise a wiring of a gate drive circuit, the gate drive circuit comprising a plurality of TFTs is formed in the peripheral wiring region 02 while the TFT is formed in the pixel region 01. Signals from the gate drive circuit are transmitted to the gate line 11 through the gate lead wire 12 to control the TFT to switch on/off.

Of course, in a case that the first electrically conductive layer further comprises the third signal line, as shown in FIG. 5, the first electrically conductive layer may comprise a source and drain conductive layer. In this case, the first electrically conductive pattern may comprise the source electrode 21 and the drain electrode 22, the first signal line may comprise the data line 23 connected electrically to the source electrode 21 or the drain electrode 22, and the first lead wire may comprise the data lead wire 24 for the data line. The source electrode 21, the drain electrode 22 and the data line 23 are located in the pixel region 01, the data lead wire 24 are located in the peripheral wiring region 02, and the third signal line may be located in the pixel region and/or in the peripheral wiring region as necessary.

In an embodiment, the third signal line may comprise a common electrode line, or a power source line, and/or a wiring forming a gate drive circuit, and/or a wiring forming a source drive circuit.

The second electrically conductive layer may comprise a gate conductive layer. In this case, the second electrically conductive pattern is formed as the gate electrode 10, the second signal line is formed as the gate line 11, and the second lead wire is formed as the gate lead wire 12. The electrically conductive retaining pattern comprises a first gate retaining pattern 13 and a second gate retaining pattern (not shown in FIG. 5). The first gate retaining pattern 13 covers the first via-hole 31 and the second gate retaining pattern covers the second via-hole (not shown in FIG. 5). The gate electrode 10 and the gate line 11 are located in the pixel region 01, the gate lead wire 12 and the first gate retaining pattern 13 are located in the peripheral wiring region 02 around the pixel region 01, and the second gate retaining pattern is located in the pixel region and/or in the peripheral wiring region, and its specific location is determined depending on the location of the third signal line.

Though a semiconductor active layer is not mentioned in the above structure, those skilled in the art may understand that it is necessary to form a TFT during forming the TFT array substrate. Thus, in the above embodiment, it is necessary to form the semiconductor active layer in order to form the TFT.

Therefore, the TFT in the pixel region of the TFT array substrate is formed. During the process, if the third signal line comprises a wiring of a source drive circuit, the source drive circuit comprising a plurality of TFTs is formed in the peripheral wiring region 02 while the TFT is formed in the pixel region 01. Signals from the source drive circuit are transmitted to the data line 23 through the data lead wire 24.

As shown in FIGS. 6a and 6b, the TFT array substrate further comprises a first electrode 50 in the pixel region 01, wherein the first electrode 50 is connected electrically to the drain electrode 22.

In an embodiment, if the source electrode 21 and the drain electrode 22 are formed after the gate electrode 10 is formed, the first electrode 50 may be connected electrically to the drain electrode 22 directly, or may also be connected electrically to the drain electrode 22 indirectly. If the first electrode 50 is connected electrically to the drain electrode 22 directly, the first electrode 50 may be formed prior to the drain electrode 22, that is, the first electrode 50 may be formed before the second electrically conductive film 20 is formed, then the second electrically conductive film 20 is patterned to form the drain electrode. Referring to FIG. 6b, the first electrode 50 may be formed after the drain electrode 22 is formed. If the first electrode 50 is connected electrically to the drain electrode 22 indirectly, as shown in FIG. 6c, after the drain electrode 22 is formed, a protective layer comprising a via-hole through which the drain electrode 22 is exposed is formed and then the formed first electrode 50 is connected electrically to the drain electrode 22 through the via-hole formed in the protective layer.

In the embodiment shown in FIG. 5, the source electrode 21 and the drain electrode 22 are formed prior to the gate electrode 10, and the first electrode 50 is connected electrically to the drain electrode 22 indirectly.

In an embodiment, the first electrode 50 may be used as a pixel electrode. In this case, the method of manufacturing the TFT array substrate further comprises a step of forming a common electrode.

As for an in-plane switch (IPS) array substrate, the pixel electrode and the common electrode are arranged in one layer and spaced apart from each other, and are formed as strip electrodes. As for an advanced-super dimensional switching (ADS) array substrate, as shown in FIG. 7, the pixel electrode and the common electrode 60 are arranged in different layers, wherein an upper electrode is formed as a strip electrode and a lower electrode is formed as a plate electrode.

The first electrode 50 may also be formed as an anode or a cathode. In this case, the method of manufacturing the TFT array substrate further comprises a step of: forming an organic functional layer, and an anode or a cathode. Specifically, the step comprises forming the organic functional layer and the cathode if the first electrode 50 is used as the anode. It comprises forming the organic functional layer and the anode if the first electrode 50 is used as the cathode.

In an embodiment, the organic functional layer comprises at least an electron transport layer, a luminescent layer and a hole transport layer. In order to increase an efficiency of injecting electrons and holes into the luminescent layer, the organic functional layer may also comprise an electron injection layer disposed between the cathode and the electron transport layer and a hole injection layer disposed between the anode and the hole transport layer.

A flexible display substrate may be sorted into a single-side light emitting flexible display substrate and a double-side light emitting flexible display substrate according to materials of the anode and the cathode. If one of the anode and the cathode includes opaque material, the flexible display substrate is a single-side light emitting type. If both the anode and the cathode include transparent material, the flexible display substrate is a double-side light emitting type.

According to a further embodiment of the present disclosure, it is provided a display device comprising the array substrate as stated in the above various embodiments.

Specifically, the display device may be a liquid crystal display device, in particular, may be a product or a component with any display functions such as a liquid crystal display, a liquid crystal television, a digital photo frame, a cellphone, a tablet computer, etc. Of course, the display device may also be an organic electroluminescent diode display device.

In the TFT array substrate, the method of manufacturing the same and the display device according to the embodiments of the present disclosure, as the insulation layer is provided with the via-hole through which the first lead wires are exposed, the second electrically conductive film is connected electrically to the first lead wire through the via-hole after the second electrically conductive film of the second electrically conductive layer is deposited. Thus, as long as electric charge is accumulated in the first electrically conductive pattern and/or the first signal line, the accumulated charge will be distributed evenly into all of the first signal lines, the first electrically conductive pattern and the second electrically conductive film through an electric connection between the first lead wire and the second electrically conductive film. As a result, an electrostatic discharge due to a large electric potential difference between certain conductors and other conductors overlapped on different layers, which is caused by a charge accumulation on these conductors, will not occur. Thus, the embodiments of the present disclosure may reduce effectively the electrostatic discharge occurring during manufacturing the TFT array substrate and thus increase the product yield.

The foregoing descriptions are merely specific implementation manners of the present invention, but are not intended to limit the protection scope of the present invention. Any variation or replacement may be readily figured out by those skilled in the art within the technical scope disclosed in the present invention shall fall within the protection scope of the present invention. Therefore, the protection scope of the present invention shall be subject to the protection scope of the claims.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features.

What is claimed is:

1. A method of manufacturing a TFT array substrate comprising steps of:

forming a first electrically conductive layer on a substrate, the first electrically conductive layer comprising a source electrode, a drain electrode and a data line connected electrically to the source electrode or drain electrode which is located in a pixel region, and a data lead wire connected electrically to the data line;

forming an insulation layer on the substrate formed with the first electrically conductive layer, the insulation layer being formed with a first via-hole through which the data lead wire is exposed;

forming a second electrically conductive film on the substrate formed with the insulation layer, the second electrically conductive film being connected electrically to the data lead wire through the first via-hole formed in the insulation layer; and patterning the second electrically conductive film to form a second electrically conductive layer comprising a gate electrode and a gate line connected electrically to the gate electrode in the pixel region, wherein the second electrically conductive layer further comprises an electrically conductive retaining pattern covering the first via-hole, and the electrically conductive retaining pattern is electrically insulated from the gate line.

2. The method of manufacturing claim 1, further comprising: performing an electrostatic elimination on the substrate formed with the second electrically conductive film after forming the second electrically conductive film.

3. The method of claim 1, wherein the data lead wire is located in a peripheral wiring region around the pixel region.

4. The method of claim 1,
wherein, after patterning the second electrically conductive film, a plurality of the data lines are insulated from each other.

5. The method of claim 4, wherein the second electrically conductive layer further comprises a gate lead wire located in the peripheral wiring region and connected electrically to the gate line.

6. A TFT array substrate comprising a first electrically conductive layer, an insulation layer and a second electrically conductive layer arranged on a substrate sequentially, wherein, the first electrically conductive layer comprises: a source electrode, a drain electrode and a data line connected electrically to the source electrode or drain electrode which are located in a pixel region; and a data lead wire connected electrically to the data line, a plurality of the data lines being electrically insulated from each other;

the insulation layer is formed with a first via-hole through which the data lead wire is exposed; and the second electrically conductive layer comprises a gate electrode and a gate line connected electrically to the gate electrode which is located in a pixel region, wherein the second electrically conductive layer further comprises an electrically conductive retaining pattern covering the first via-hole, and the electrically conductive retaining pattern is electrically insulated from the gate line.

7. The TFT array substrate of claim 6, wherein the data lead wire is located in a peripheral wiring region around the pixel region.

8. The TFT array substrate of claim 6, wherein the second electrically conductive layer further comprises a gate lead wire located in a peripheral wiring region and connected electrically to the gate line.

9. A display device comprising the TFT array substrate of claim 6.

* * * * *